(12) United States Patent
Shen

(10) Patent No.: US 10,698,056 B2
(45) Date of Patent: Jun. 30, 2020

(54) MAGNETIC RESONANCE MAGNIFICATION IMAGING

(71) Applicant: The United States of America, as represented by the Secretary, Department of Health & Human Services, Rockville, MD (US)

(72) Inventor: Jun Shen, Bethesda, MD (US)

(73) Assignee: The United States of America, as represented by the Secretary, Department of Health & Human Services, Rockville, MD (US)

(*) Notice: Subject to any disclaimer, the term of this patent is extended or adjusted under 35 U.S.C. 154(b) by 211 days.

(21) Appl. No.: 15/516,339

(22) PCT Filed: Oct. 2, 2015

(86) PCT No.: PCT/US2015/053730
§ 371 (c)(1),
(2) Date: Mar. 31, 2017

(87) PCT Pub. No.: WO2016/054513
PCT Pub. Date: Apr. 7, 2016

(65) Prior Publication Data
US 2017/0248668 A1    Aug. 31, 2017

Related U.S. Application Data

(60) Provisional application No. 62/059,520, filed on Oct. 3, 2014.

(51) Int. Cl.
*G01R 33/483* (2006.01)
*G01R 33/54* (2006.01)
(Continued)

(52) U.S. Cl.
CPC ....... *G01R 33/4833* (2013.01); *G01R 33/483* (2013.01); *G01R 33/54* (2013.01);
(Continued)

(58) Field of Classification Search
CPC .. G01R 33/4833; G01R 33/54; G01R 33/483; G01R 33/58; G01R 33/543; G01R 33/5604
(Continued)

(56) References Cited

U.S. PATENT DOCUMENTS 7,840,049 B2* 11/2010 Stemmer ............. G01R 33/561
                                                324/309
8,823,372 B2*  9/2014 Weber ................ G01R 33/4833
                                                324/307

(Continued)

OTHER PUBLICATIONS

Ito S et al: "Alias-free image reconstruction using Fresnel transform in the phase-scrambling Fourier imaging technique", Magnetic Resonance in Medicine, John Wiley & Sons, Inc, US, vol. 60, No. 2, Aug. 1, 2008 (Aug. 1, 2008), pp. 422-430.

(Continued)

*Primary Examiner* — Rishi R Patel
(74) *Attorney, Agent, or Firm* — Locke Lord LLP; Christopher J. Capelli; Judy R. Naamat

(57) ABSTRACT

One aspect of the present disclosure provides an imaging method including: specifying an imaging focus region on a subject to be imaged, applying radiofrequency pulses to the subject to interact with a magnetic field gradient, wherein the radiofrequency pulses successively bend magnetization phases of respective electromagnetic signals from the specified imaging focus region, resulting in magnified pixel data, and generating a magnified image of the imaging focus region based on the magnified pixel data.

16 Claims, 14 Drawing Sheets

(51) Int. Cl.
*G01R 33/58* (2006.01)
*G01R 33/56* (2006.01)

(52) U.S. Cl.
CPC ......... *G01R 33/543* (2013.01); *G01R 33/546* (2013.01); *G01R 33/5604* (2013.01); *G01R 33/58* (2013.01)

(58) Field of Classification Search
USPC .................. 324/300–322; 600/407–435; 382/128–131
See application file for complete search history.

(56) References Cited

U.S. PATENT DOCUMENTS

| | | | |
|---|---|---|---|
| 9,551,770 B1* | 1/2017 | Nasiraei Moghaddam | ................ G01R 33/4806 |
| 2006/0264735 A1* | 11/2006 | Stemmer | ............ G01R 33/4824 600/410 |
| 2007/0057673 A1* | 3/2007 | Nayak | ................ G01R 33/4833 324/307 |
| 2011/0241678 A1* | 10/2011 | Weber | ................ G01R 33/4833 324/309 |
| 2015/0310641 A1* | 10/2015 | Purdy | ................. G01R 33/565 382/131 |
| 2017/0248668 A1* | 8/2017 | Shen | .................... G01R 33/483 |

OTHER PUBLICATIONS

Shen Jun: "Magnification imaging by radiofrequency-induced nonlinear phase encoding", Proceedings of the International Society for Magnetic Resonance in Medicine, 23nd Annual Meeting and Exhibition, Toronto, Canada, May 30-Jun. 5, 2015, vol. 23, May 15, 2015 (May 15, 2015), p. 99.

Holland D et al: "Efficient correction of inhomogeneous static magnetic field-induced distortion in Echo Planar maging", Neuroimage, Academic Press, Orlando, FL, US, vol. 50, No. 1, Nov. 26, 2009 (Nov. 26, 2009), pp. 175-183.

Yu Li et al: "Regionally Optimized Reconstruction for Partially Parallel Imaging in MRI Applications", IEEE Transactions on Medical Imaging, IEEE Service Center, Piscataway, NJ, US, vol. 28, No. 5, Dec. 9, 2008 (Dec. 9, 2008), pp. 687-695.

Maryam Yashtini et al: "Partially parallel MR image reconstruction using sensitivity encoding", Image Processing (ICIP), 2012 19th IEEE International Conference on, IEEE, Sep. 30, 2012 (Sep. 30, 2012), pp. 2077-2080.

* cited by examiner

Examples of One-dimensional Magnification Imaging and Reconstruction

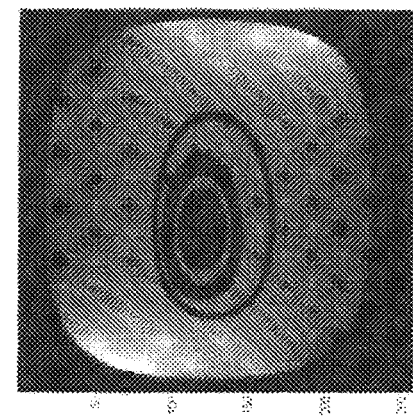
FIG. 4A  Conventional spin-echo MRI image
FIG. 4B  Raw magnified image using 128 phase-bending radiofrequency pulses
FIG. 4C  Regridded image in phase encoding direction In Vivo Experiments - Rat Brain MRI Images Conventional spin-echo MRI image Raw magnified image with imaging focus at brain midline Regridded magnified image Magnified image of the olfactory bulb/cerebral cortex area Additional In Vivo Experiments - Rat Brain MRI Images Left, expansion of superior colliculus region of conventional MRI image; Right, expansion of superior colliculus region of magnified image Left, conventional spin-echo MRI image; Right, regridded magnified (3x) image using 128 bent-phase profiles

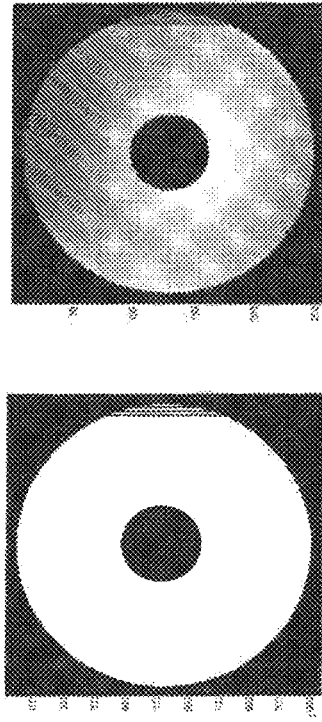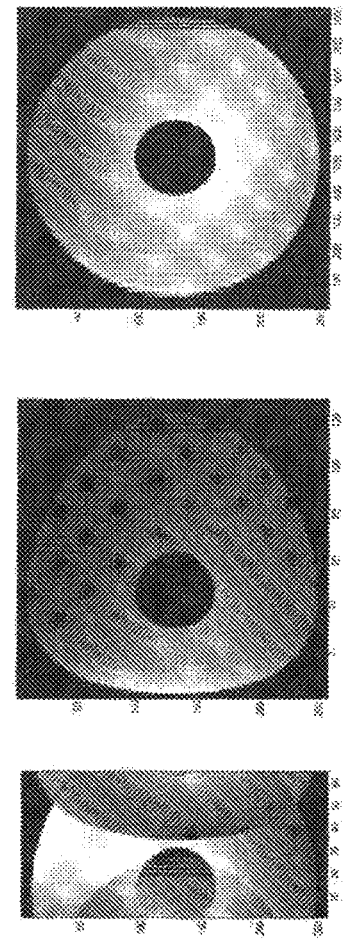

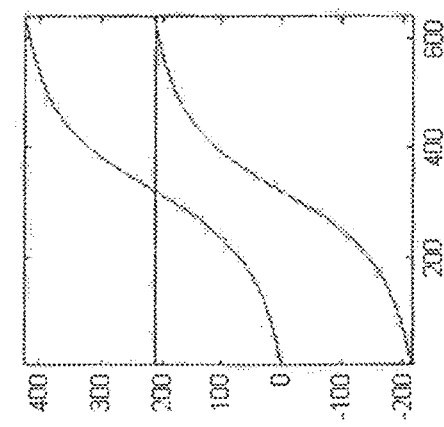
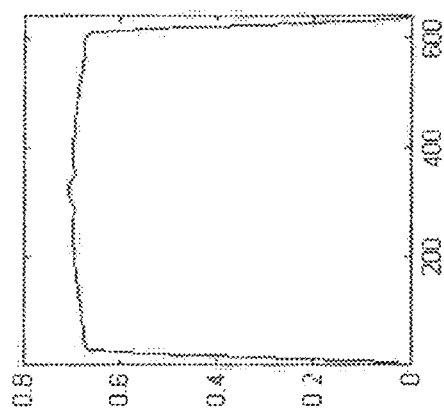
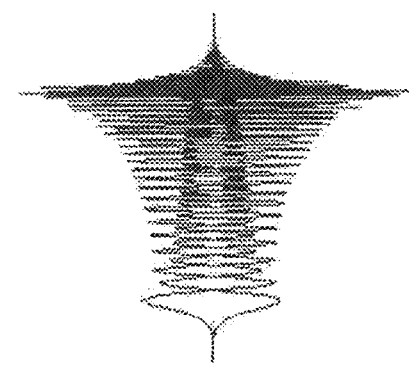
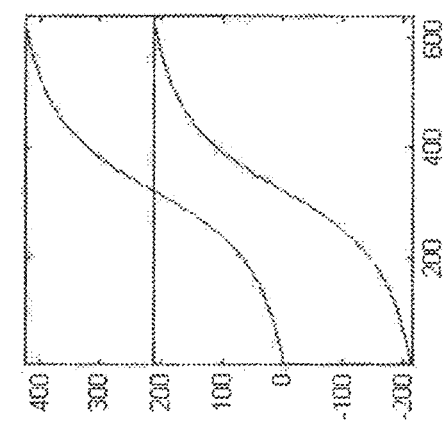
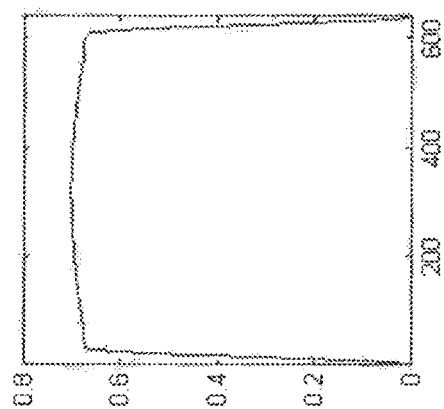
FIG. 9

Left - conventional spin echo MRI of rat brain with uniform spatial resolution; Right - 2x magnified image of the rat brain using 128 pulses with arctangent phase profiles Left - conventional spin echo MRI of rat brain with uniform spatial resolution; Right - 3x magnified image of the rat brain using 128 pulses with a phase template described by $\varphi(r) = A(\operatorname{atan}(\alpha r)) + Br$, where $A = 0.276$, $B = 0.243$, and $\alpha = 10.0$ Image using double-foci magnification of phantom having a bundle of thin tubes with same wall thickness

MAGNETIC RESONANCE MAGNIFICATION IMAGING

CROSS-REFERENCE TO RELATED APPLICATIONS

This application claims the benefit of and priority to U.S. Provisional Application 62/059,520 filed Oct. 3, 2014, which is incorporated herein by reference in its entirety.

GOVERNMENT RIGHTS STATEMENT

The invention described herein was developed with support from the National Institute of Health under contract HHSN263200900028I. The U.S. government may have certain rights to the invention.

TECHNICAL FIELD

The present subject matter relates generally to magnetic resonance imaging (MRI) systems, algorithms, and methods, and more particularly, to selectively enhancing the resolution of an area during an MRI scan.

BACKGROUND

Magnetic resonance imaging (MRI) is a widely used medical imaging technique used to investigate and diagnose the anatomy and/or physiology of the body. Typical MRI scanners use a combination magnetic fields and radiowaves to form images of the body. In general, MRI is a slow imaging method. This is partly because MRI is based on frequency space (e.g., k-space) line-scanning techniques. As such, it is inherently time-consuming to generate high-dimensional images with high spatial resolution. In most MRI exams, the operator prescribes a "slice" or "slices" in a region of interest (e.g., a kidney, a tumor, and the like) of a subject to be imaged. Because of the intrinsic properties of MRI, the slices have to be scanned line-by-line in k-space with different phase-encoding for each line.

In order to image the region of interest with a high spatial resolution, existing MRI techniques spend an excessive amount of time imaging the entire slice with equal spatial resolution. In other words, it is necessary to generate a uniform image resolution across the entire image slice. This produces an "all or nothing" approach which wastes scanning time, as the entire slice must be imaged to high spatial resolution so as to attain the desired high spatial resolution at certain region of interest. As a result, spatial resolution is often sacrificed due to practical time constraints on the scanning process, which leads to loss of fine anatomical details.

MRI data acquisition can be accelerated by partial parallel imaging (PPI) which reduces the number of k-space lines needed to form an image by taking advantage of the inherent localizing power in the heterogeneous sensitivity profiles of multi-channel receiver coils. PPI has improved clinical MRI and found widespread applications by either increasing imaging speed for the same spatial resolution, or equivalently, increasing spatial resolution for the same scan time. However, clinical PPI is limited to low imaging acceleration (i.e., <2×) due to noise amplification and convolution of artifacts at high acceleration rate. Accordingly, there is a need for MRI techniques capable of reducing the scan time necessary to image a subject at an increased focal spatial resolution without the imaging limitations suffered by PPI. If such a technique is compatible with PPI, then the increase in spatial resolution from it and that from PPI can multiply each other.

SUMMARY

According to embodiments of the present disclosure, an imaging method includes: specifying an imaging focus region on a subject to be imaged, applying radiofrequency pulses to the subject to interact with a magnetic field gradient, wherein the radiofrequency pulses successively bend magnetization phases of respective electromagnetic signals from the specified imaging focus region. Phase bending by radiofrequency pulses has the effect of stretching the imaging focus region in a phase-encoding direction, resulting in magnified pixel data, and generating an image of the object with magnified imaging focus region based on the magnified pixel data.

According to embodiments of the present disclosure, the radiofrequency pulses to be applied can be constructed according to a process that includes: designing a smoothly-varying monotonic magnetization phase curve from $-\pi$ to $\pi$ as the phase module, designing a trapezoid magnetization amplitude module with its two top vertices smoothed, extending the phase module at both ends to match the bottom two vertices of the amplitude module, and designing the radiofrequency pulses such that an amplitude of the frequency response of the radiofrequency pulses substantially matches the amplitude module, and a phase of the frequency response of the radiofrequency pulses substantially matches the phase module and its multiples. The radiofrequency pulses may be designed using Fourier transform.

According to embodiments of the present disclosure, the generating of the magnified image may include: reconstructing the magnified pixel data in order to form the magnified image of the imaging focus region. The magnified pixel data may be reconstructed using Fourier transform. The generating of the magnified image also include: mathematically inverting a process by which the magnified pixel data was formed and/or experimentally measuring a magnetization magnitude and a phase module on an imaging phantom and regridding the magnified pixel data to a larger image size in a phase-encoding direction and/or smoothing the magnified image.

According to embodiments of the present disclosure, a plurality of imaging focus regions on the subject to be imaged may be specified. Further, the imaging focus region may be specified inside an image field-of-view. Even further, a length of aperture stop may be specified inside the image field-of-view. Yet even further, the region of interest may be a kidney, a tumor, or the like.

According to embodiments of the present disclosure, a non-transitory computer readable medium containing program instructions executable by a processor includes: program instructions that specify an imaging focus region on a subject to be imaged, program instructions that apply radiofrequency pulses to a region of interest of the subject to interact with a magnetic field gradient, wherein the radiofrequency pulses successively bend magnetization phases of respective electromagnetic signals from the specified imaging focus region, resulting in magnified pixel data, and program instructions that generate a magnified image of the imaging focus region based on the magnified pixel data.

According to embodiments of the present disclosure, a magnetic resonance imaging device includes: a magnetic field gradient controller programmed to control operation of a magnetic field gradient amplifier to alter a spinning frequency of atomic nuclei within a subject, a radio frequency pulse controller programmed to control operation of a radiofrequency transmitter to apply radiofrequency pulses to a region of interest within the subject, an analog/digital signal converter programmed to convert analog signals received by a radiofrequency receiver coil, and an imaging sequence controller programmed to: specify an imaging focus region on the subject; apply radiofrequency pulses to the region of interest of the subject to interact with a magnetic field gradient, wherein the radiofrequency pulses successively bend magnetization phases of respective electromagnetic signals from the specified imaging focus region, resulting in magnified pixel data; and generate a magnified image of the imaging focus region based on the magnified pixel data

BRIEF DESCRIPTION OF THE DRAWINGS

For a fuller understanding of the nature and desired objectives of the present subject matter, reference is made to the following detailed description taken in conjunction with the accompanying drawing figures. Like reference numerals denote corresponding parts throughout the several views.

FIGS. 4A-4C depict another example of phantom experiments according to embodiments of the present disclosure.

FIGS. 7A-7E depict examples of partial parallel magnification imaging according to embodiments of the present disclosure.

FIG. 9 depicts examples of phase-bending radiofrequency pulses generated using Eq. [2] and their frequency response.

DEFINITIONS

Figure 1:
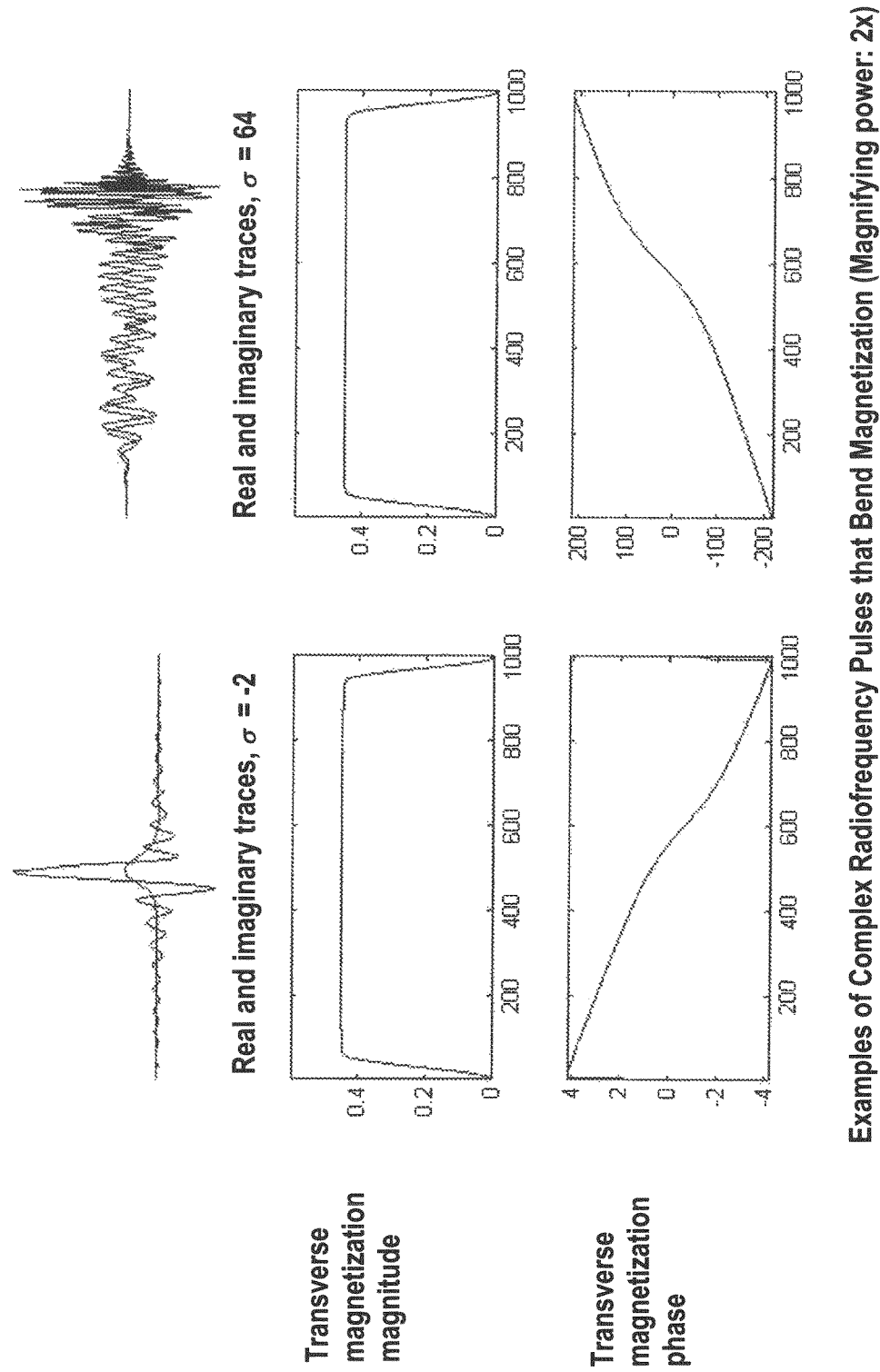
FIG. 1 depicts examples of amplitude- and phase-modulated radiofrequency pulses which bend the magnetization phase at a predefined imaging focus according to embodiments of the present disclosure.

For the purposes of the present application, the following terms will have the following meanings unless specifically stated otherwise:

The phrase "Magnetic Resonance Imaging" or "MRI" as used herein means the process by which certain nuclei, when placed in a magnetic field, absorb and release energy in the form of radio waves that are analyzed by a computer, thereby producing an image (e.g., of structures, human anatomy, and physiological information). The present subject matter and methods can be employed with MRI generated with MRI equipment from any manufacturer. In some embodiments, the MRI equipment or scanner shall have a scanner housing with a magnet with a typical magnetic field ($B_0$), ranging from about 0.5 to about 7 Tesla or higher, positioned inside the housing. In biomedical applications, the subject to be imaged (e.g., a human body) lies on the scanner table or is disposed within the bore of the MRI equipment and the hydrogen and other nuclei in the subject are realigned in certain directions. Magnetic field gradient coils are arranged near the imaged subject to superimpose on $B_0$ an additional selected spatially-varying magnetic field. One or more radiofrequency (RF) coils are arranged inside the bore of the magnet to transmit RF excitation and inversion pulses ($B_1$). The RF coils also measure the RF magnetic resonance signal emitted from the imaged subject. The gradient coils and the RF transmitter coils are turned on and off at specific strengths and for specific duration according in a predetermined sequence of actions collectively called an imaging sequence. At specific time points during the execution of the imaging sequence, the RF receiver coils measure the RF signals emitted from the subject. Images of structures such as body parts or organs are created from the measured RF signals during or after the completion of the imaging sequence.

The term "memory" as used herein encompasses both volatile memory (e.g., random access memory and the like) and non-volatile memory (e.g., read-only memory, hard disks, floppy discs, magnetic tape, optical discs, paper table, punch cards, and the like).

The term "subject" as used herein shall be understood to include any animal including mammals including, but not limited to, humans, primates, as well as non-living objects.

The term "slice" as used herein shall be understood to include both two-dimensional and three-dimensional images of an object.

As used in the specification and claims, the singular form "a," "an," and "the" include plural references unless the context clearly dictates otherwise.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from context, all numerical values provided herein are modified by the term about.

As used in the specification and claims, the terms "comprises," "comprising," "containing," "having," and the like can have the meaning ascribed to them in U.S. patent law and can mean "includes," "including," and the like.

Ranges provided herein are understood to be shorthand for all of the values within the range. For example, a range of 1 to 50 is understood to include any number, combination of numbers, or sub-range from the group consisting of 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 (as well as fractions thereof unless the context clearly dictates otherwise).

Unless specifically stated or obvious from context, as used herein, the term "or" is understood to be inclusive.

DETAILED DESCRIPTION

As noted above, in order to image the region of interest with a high spatial resolution, existing MRI techniques spend an excessive amount of time imaging the entire slice with equal spatial resolution. In other words, it is necessary to generate a uniform image resolution across the entire image slice. This produces an "all or nothing" approach which wastes scanning time, as the entire slice must be imaged with uniform high spatial resolution to attain the desired high spatial resolution at a region of interest. As a result, spatial resolution is often sacrificed due to practical time constraints on the scanning process, which leads to loss of fine anatomical details. Accordingly, there is a need for MRI techniques capable of reducing the scan time necessary to image a subject at an increased focal spatial resolution.

For the sake of comparison, in optical magnification, travelling electromagnetic rays can be bent by a convex magnifier such that details from the focus of the magnifier fill a disproportionally large area of the field-of-view. Conversely, in conventional MRI, such magnification of a region of interest is not possible.

Aspects of the present disclosure address the above shortcomings of conventional MRI techniques by selectively enhancing the resolution of an area during an MRI scan. Stated generally, aspects of the present disclosure magnify a region of interest during an MRI scan by using specially designed radiofrequency pulses to interact with magnetic field gradients such that the magnetization phase at the region of interest is bent precisely as prescribed herein. By successively bending the phase of electromagnetic signals from the region of interest, the differential phase evolution at the region of interest is made faster than conventional MRI, leading to focal resolution enhancement in a manner similar to optical magnification, as described above. Because phase encoding is one of the most time-consuming parts of MRI, the techniques described herein (i.e., "magnetic resonance magnification imaging") reduce scan time for a predefined focal spatial resolution. Or equivalently, the techniques increase spatial resolution at the imaging focus for the same scan time. Notably, the magnetic magnification imaging techniques of the present disclosure may produce up to 4× magnifying power at a single predefined focus region.

Theory

RF Pulses for Bending Magnetization Phase at Region of Interest

Within the realm of linear response theory the transverse magnetization $M_{xy}(r)$ excited by a RF pulse $B_1(t)$ ($t \in 0 \sim T_p$) is related by Fourier transform:

$$M_{xy}(r) = iM_0 \int_0^{T_p} B_1(t) e^{-i2\pi Grt} dt \quad [1]$$

where G is the magnetic field gradient vector. For an amplitude-modulated RF pulse (i.e., no imaginary components), $M_{xy}(r)$ has a linear phase gradient which can be cancelled by magnetic field gradient reversal. Eq. [1] can be inverted to craft complex RF pulses that bend the magnetization phase at region of interest. Examples of phase-bending complex RF pulses generated by inverting Eq. [1] and their frequency response calculated using Bloch equations are shown in FIGS. 1 and 9.

$M_{xy}(r)$ predicted by Eq. [1] may deviate from Bloch simulation. When necessary, this deviation, $\Delta M_{xy}(r)$, can be corrected by noting that when $B_1(t)$ deviates from the linear response theory $\Delta B_1(t)$ still meet the requirements of the linear response theory since $|\Delta B_1(t)| \ll |B_1(t)|$. Therefore, the corrected complex RF pulse $B_1(t)'$ can be calculated using inverse Fourier transform $$B_1(t)' \propto \int_{-\infty}^{+\infty} (M_{xy}(r) + \Delta M_{xy}(r)) e^{i2\pi Grt} dr \quad [2]$$

Details on designing RF pulses for bending magnetization phase at imaging focus are provided in further detail below.

Magnification Encoding and Image Reconstruction

In conventional MRI, spin density $\rho(r)$ is related to k-space signal $s(k)$ by Fourier transform $$s(k) = \int_{-\infty}^{+\infty} \rho(r) e^{-i2\pi kr} dr \quad [3]$$

By successively bending the magnetization phase at region of interest using RF pulses described by Eq. [2], $\rho(r)$ is modulated by spatially dependent phase function $\sigma(r)$ (e.g., see FIG. 1). Accordingly, Eq. [3] is generalized to $$s(\sigma) = \int_{-\infty}^{+\infty} \rho(r) e^{-i2\pi \sigma(r)} dr \quad [4]$$

Eq. [4] can be linearized by remapping spin density into a warped space $\varphi = \varphi(r)$ such that $$\sigma(r) = \sigma \varphi \quad [5]$$

where the phase encoding step counter $\sigma$ is independent of r. $\varphi(r)$ describes magnetization phase ($\varphi(r) \in -0.5 \sim 0.5$) produced by the RF pulse for phase encoding step $\sigma=1$. Substituting Eq. [5] into Eq. [4] and perform inverse Fourier transform we obtain $$\rho(\varphi(r)) = \left|\frac{d\varphi}{dr}\right| \int_{-\infty}^{+\infty} s(\sigma) e^{i2\pi\sigma\varphi} d\sigma \quad [6]$$

$$\left|\frac{d\varphi}{dr}\right|$$

in Eq. [6] compensates for intensity changes accompanied by stretching the object. The reconstructed $\rho(\varphi(r))$ image is then regridded to generate the desired spin density map $\rho(r)$.

The uniform pixel size $\Delta x_0$ in conventional MRI with N points equals to field-of-view (FOV)/N, which is now generalized to the following in magnification imaging:

$$\Delta x(r) = \left|\frac{dr}{d\varphi}\right| \Delta \varphi = \left|\frac{dr}{d\varphi}\right| \frac{\Delta x_0}{FOV} \quad [7]$$

Focal magnification is achieved at imaging focus where $$FOV \left|\frac{d\varphi}{dr}\right| > 1.$$

Phase-Bending RF Pulse Design Based on Linear Response Theory

Magnification imaging is based on interactions between magnetic field gradients used in conventional MRI and specially designed radiofrequency pulses to successively bend magnetization phase at imaging focus. For illustration purposes, we describe here designing RF pulses that produce an arctangent phase responses. The phase template $\varphi(r)$ is given by $$\varphi(r) = \frac{\text{atan}(\alpha r)}{2\text{atan}(\alpha/2)} \quad [8]$$

Here r is normalized by FOV. For 2× magnification at r=0, we have $$\left.\frac{d\varphi}{dr}\right|_{r=0} = 2$$

when α=4.66. The transverse magnetization amplitude has a trapezoid shaped with its two slopes smoothed using half-sine functions. The flat top of the trapezoid matches the image FOV with its phase described by Eqs. [5] and [8]. Then a series of N complex RF pulses were generated using Eq. [2] as in FIG. 9 for σ

$$\varepsilon - \frac{N}{2} + 1 \sim \frac{N}{2}.$$

The RF pulse for σ=0 is a sinc-like pulse with no imaginary components. Each {σ, −σ} pulse pair form a Hermitian function because Eq. [2] is invariant to simultaneous time reversal and complex conjugation.

FIG. 9 top row shows the complex RF pulse for σ=64 with the arctangent phase profile generated by inverting Eq. [1] and its frequency response for flip angle=45°. Small distortion in magnitude of the excited transverse magnetization is seen at imaging focus. Since the magnetization phase profile remains ideal the magnitude profile was fitted using a fourth order polynomial. $\Delta M_{xy}(r)$ was synthesized from fit residuals and φ(r) given by Eq. [8]. $\Delta B_1(t)\times 32$ calculated from $\Delta M_{xy}(r)$ was shown in the left panel of the bottom row of FIG. 9. Results from Bloch simulation of the corrected RF pulse $B_1(t)'$ were given in the bottom row. A second iteration was found to be unnecessary.

Figure 10A:
FIGS. 10A and 10B depict examples of magnification imaging of a rat brain.
Figure 10B:

Furthermore, FIGS. 10A and 10B illustrate example images of a rat brain generated according to various imaging methodologies. In particular, FIGS. 10A and 10B, on left, each show a horizontal image of rat brain by conventional spin echo MRI with uniform spatial resolution. In contrast, FIG. 10A, on right, shows a 2× magnified image of the rat brain using 128 pulses with arctangent phase profiles. Similarly, FIG. 10B, on right, shows a 3× magnified image of the rat brain using 128 pulses with a phase template described by φ(r)=A(atan(αr))+Br, where A=0.276, B=0.243, and α=10.0.

Magnification with Linearly Varying Spatial Resolution

Instead of focal magnification, an image with linearly varying spatial resolution can also be very useful for many applications. The phase template Φ(r) is given by $$\Phi(r)=0.6r^2+r-0.15 \qquad [9]$$

for r∈−½~½. Note that spatial resolution and pixel size here vary linearly across the field of view and $$\left.\frac{d\varphi}{dr}\right|_{r=-0.5} : \left.\frac{d\varphi}{dr}\right|_{r=0.5} = 1:4.$$

Figures 11A, 11B, 11C:
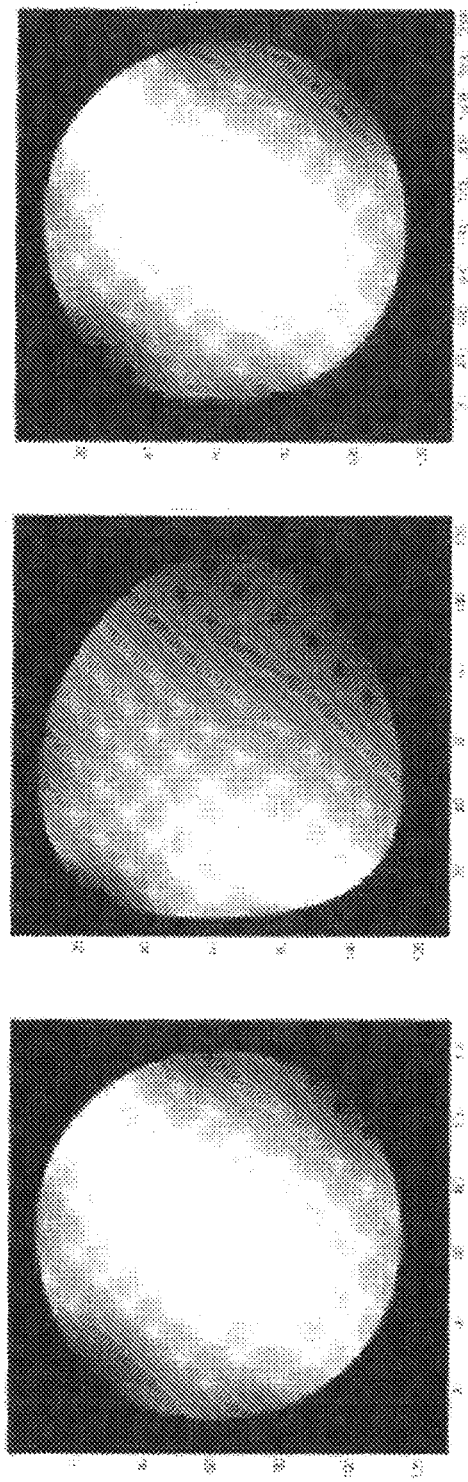
FIGS. 11A-11C depict pixel changes using magnification with linearly varying spatial resolution.

The imaging results are shown in FIGS. 11A-11C where the image pixel size changes linearly along the phase-encoding direction after regridding. FIG. 11A shows a regular MRI with uniform spatial resolution across the entire field of view. The field of view is 32 mm and matrix size is 256×128. FIG. 11B is the raw image generated using 128 phase bending radiofrequency pulses. In FIG. 11B, the object seems to be stretched with the degree of stretching varying linearly across the object. In FIG. 11C, the image was regridded to 2014 in phase encoding direction, with the image pixel size changing linearly along the phase-encoding direction with no smoothing performed.

Magnetic Resonance Imaging Devices

Figure 8:
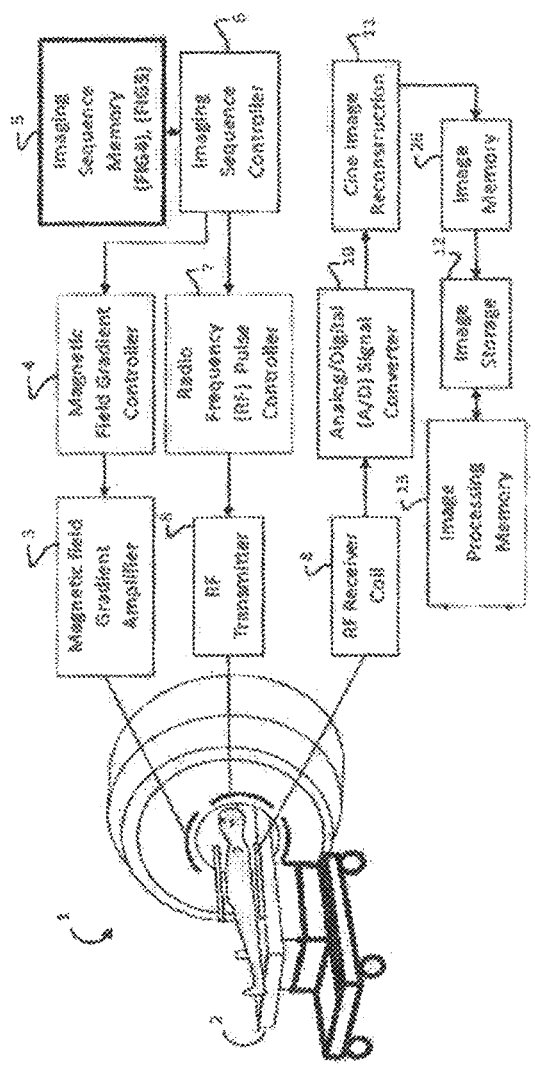
FIG. 8 depicts a schematic diagram of an example MRI system according to embodiments of the present disclosure.

Referring now to FIG. 8, an exemplary magnetic resonance imaging (MRI) device 1 is depicted. The MRI device 1 includes a scanner housing with a magnet having a typical magnetic field ($B_0$), ranging from about 0.5 to about 7 Tesla or higher, positioned inside the housing. When the subject to be imaged, for example a human body lying on the scanner table 2, is disposed within the bore of the MRI equipment, the hydrogen and other nuclei in the subject are realigned in certain directions. Magnetic field gradient coils 3 are arranged near the imaged subject to superimpose on $B_0$ an additional selected spatially-varying magnetic field. One or more radiofrequency (RF) coils 8 are arranged inside the bore of the magnet to transmit RF excitation and inversion pulses ($B_1$). The RF coils 8 also measure the RF magnetic resonance signal emitted from the imaged subject. (Some RF coils can be used to both transmit and receive RF signals, while other RF coils are used to only transmit or receive signals. The work done in this study utilized the same coil to transmit and receive RF signals. However, concepts discussed here can be applied to any type of coils.) The gradient coils 3 and the RF transmitter coils 8 are turned on and off at specific strengths and for specific duration according in a predetermined sequence of actions collectively called an imaging sequence implemented by an imaging sequence controller 6. At specific time points during the execution of the imaging sequence, the RF receiver coils 8 measure the RF signals emitted from the body. Images of body parts or organs are created from the measured RF signals during or after the completion of the imaging sequence by the image reconstruction module 11.

The MRI device 1 can include one or more modules programmed to control the operation of the MRI device 1. For example, an image sequence memory module 5 can store one or more imaging sequence algorithms, as described herein, that specify the relative timing on one or more RF and field gradient pulses. The stored imaging sequence algorithms can, for example, control the design of radiofrequency pulses that bend the magnetization phase, thereby enlarging (and enhancing) the imaging focus region of the subject in the phase-encoding direction. Such imaging sequences are described in further detail below.

The imaging sequence controller 6 can obtain one or more image sequence algorithms from the imaging sequence memory and control one or more of a magnetic field gradient controller module 4, a radio frequency (RF) pulse controller module 7, an analog/digital (A/D) signal converter module 10, and the image reconstruction module 11 in order to effect the application of RF and field gradient pulses.

The image reconstruction module 11 can communicate with the analog/digital (A/D) signal converter module 10 to receive digital images of the subject. The image reconstruction module can store these images in an image memory module 26, image storage module 12, and/or image processing memory module 13.

As will be appreciated by one of ordinary skill in the art, the various modules described herein can be distinct hardware and/or software modules or can be combined into one or more hardware and/or software modules. For example, the magnetic field gradient controller module 4, radio frequency (RF) pulse controller module 7, and analog/digital (A/D) signal converter module 10 can be interfaces provided and incorporated within the MRI device 1 while the imaging sequence controller 6 is external to the MRI device 1. Alternatively, the imaging sequence controller 6 can be incorporated within the MRI device 1.

Magnetization Phase-Bending at Imaging Focus

To magnify the regions of interest in a MRI image (hereinafter referred to as "imaging focus" or "imaging foci"), a phase encoding method, as described herein, uses specially designed radiofrequency pulses to interact with magnetic field gradients, such that the magnetization phase at a predefined focus or foci is bent precisely as prescribed. The MRI techniques of the present disclosure (hereinafter referred to as "magnetic resonance magnification imaging" or "magnification imaging") therefore lie outside the realm of k-space theory which applies to phase encoding using field gradients only. By successively bending the phase of electromagnetic signals from imaging focus during phase-encoding, the differential phase evolution at imaging focus will be faster than in conventional MRI. Since Fourier transform image reconstruction evenly divides the phase space into pixels, which is automatically performed when generating the raw magnified image of the k-space data, the imaging focus will be filled with more pixels than in conventional MRI, leading to focal resolution enhancement in a manner similar to optical magnification. Because phase encoding is one of the most time-consuming parts of MRI, magnetic resonance magnification imaging reduces scan time for a predefined focal spatial resolution. Or equivalently, it increases spatial resolution at imaging focus for the same scan time.

By evenly skipping phase encoding steps, as in PPI, as described above, or by over-bending the focal magnetization phase, the magnified image will be folded. The folded image can be unfolded using conventional PPI methods. Therefore, magnification imaging is compatible with both image domain and k-space domain PPI methods.

The magnification imaging techniques described herein are based on specific interactions between magnetic field gradients used in conventional MRI and specially designed radiofrequency pulses to bend magnetization phase at the imaging focus. To design the phase-bending radiofrequency pulses, one or more of the following steps may be performed:

1. Specify the position of imaging focus and the length of aperture stop inside the image field-of-view (FOV).
2. Design a smoothly-varying monotonic magnetization phase curve from $-\pi$ to $\pi$ as the phase module. The phase derivative at imaging focus is specified by the desired magnification. The phase module bends at the two sides of the aperture.
3. Design a trapezoid magnetization amplitude module with its two top vertices smoothed.

The flat top of the trapezoid matches the image FOV.

4. Extend the phase module at both ends to match the bottom two vertices of the amplitude module.
5. Use Fourier transform, or other mathematical methods, to design radiofrequency pulses.

The magnitude of the frequency response of the radiofrequency pulses will match the magnitude module; the phase of the frequency response of the radiofrequency pulses will match $\sigma \times$ phase module, where $\sigma$ denotes the phase encoding count. For example, for 128 phase encoding steps, $\sigma = -64 \sim 63$ or $-63 \sim 64$.

Referring now to FIG. 1, shows examples of complex radiofrequency pulses that bend magnetization phase. The top trace shows a Bloch simulation of amplitude- and phase-modulated radiofrequency pulses which bend the magnetization phase at a predefined imaging focus (focus position: pt#620; left panels: $\sigma = -2$; right panels: $\sigma = 64$). The middle and bottom traces show the amplitude and phase of the excited transverse magnetization. The middle trace shows transverse magnetization magnitude while the bottom trace shows transverse magnetization phase in radians. For the examples shown in FIG. 1, the imaging focus is centered at point #620 with a magnifying power of 2×. By this method, differential phase evolution of magnetization at the imaging focus is made faster than conventional MRI.

Magnification Imaging and Reconstruction

Magnification imaging, as described herein, can be described as a "two-step" process, although in reality, it is actually achieved in a single step. To this end, in the first step, the object to be imaged may be virtually and precisely "stretched" at the imaging focus region in the phase-encoding direction to expose its fine details there accompanied by reduced spin density. The object stretching is the result of bending the magnetization phase using the specially designed radiofrequency pulses. In the second step, an MRI imaging sequence (e.g., a conventional MRI imaging sequence) may be used to image the stretched object, followed by reconstruction using Fourier transform, or any other mathematical model, to generate the raw magnified image. Since the origin of each pixel is determined by the predefined magnetization phase module, two different exemplary methods can be used to regrid the raw magnified image:

1. Mathematically invert the stretching process; or
2. Experimentally measure the magnetization magnitude and phase modules on an imaging phantom (e.g., an object that is scanned or imaged to evaluate, analyze, and/or tune the performance of an imaging device) (hereinafter "phantom").

For better visualization, the regridded image can be displayed using evenly spaced pixels. Regridding error can be made arbitrarily small by increasing the reconstructed image matrix size in the phase encoding direction. Finally, if necessary, the image can be smoothed by standard image processing methods.

Working Example 1—One-Dimensional Simulation

Figure 2:
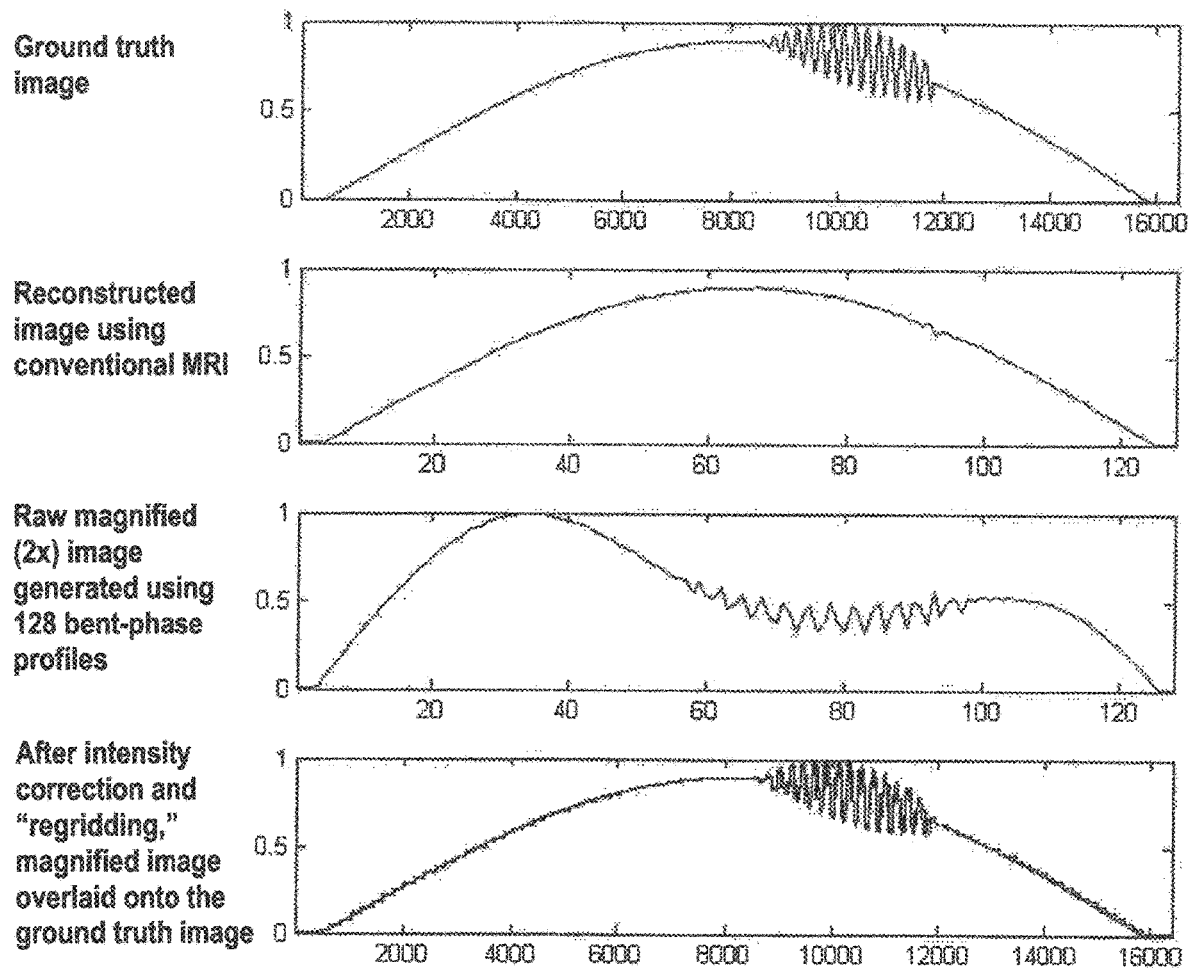
FIG. 2 depicts examples of one-dimensional magnification imaging and reconstruction according to embodiments of the present disclosure.

In one example of the magnetic resonance magnification imaging techniques disclosed herein, FIG. 2 illustrates an example of one-dimensional magnification imaging and reconstruction. To this end, FIG. 2 compares: a ground truth image (from top: 1st trace); a reconstructed image using conventional MRI (2nd trace; 128 points), where the fine details were largely lost due to limited spatial resolution; and a raw magnified image generated using 128 bent-phase profiles (two were shown in FIG. 1 for phase encoding #63 ($\sigma = -2$) and 128 ($\sigma = 64$), respectively) (3rd trace; 128 points, 2× magnification, focus position: 0.12× field-of-view). After intensity correction and "regridding" to 128×128 points, the magnified image is shown in the bottom trace (4th trace) overlaid onto the ground truth image (no smoothing is performed for better visualization of focal spatial resolution enhancement). Clearly, with the same number of phase-encoding steps, focal magnification captured the fine structure around 0.12× field-of-view.

Working Examples 2 and 3—Phantom Experiments

Figure 3:
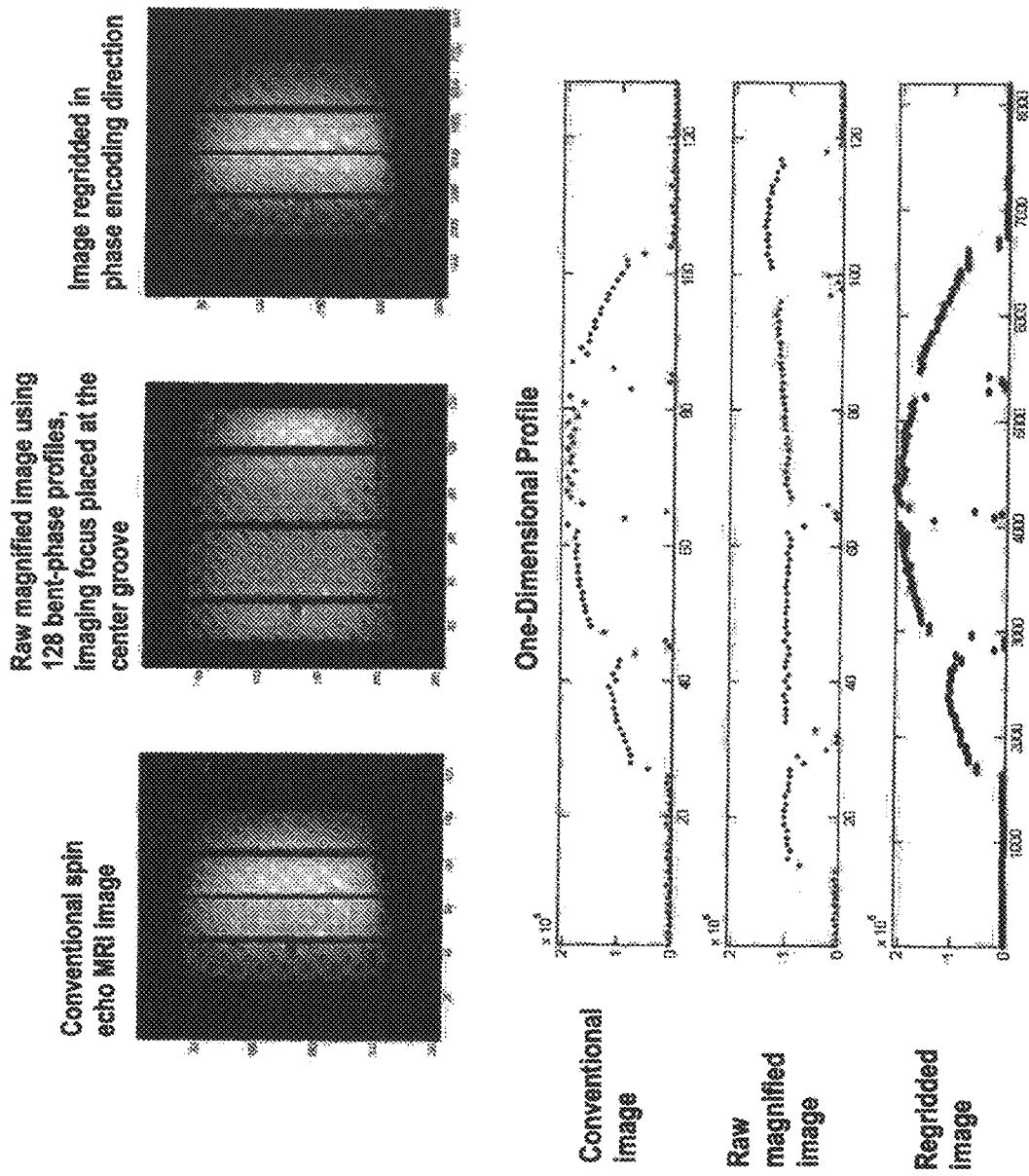
FIG. 3 depicts an example of phantom experiments according to embodiments of the present disclosure.

In additional examples of the magnetic resonance magnification imaging techniques disclosed herein, FIGS. 3 and 4 illustrate axial images of phantoms that were acquired using a Bruker 11.7 Tesla 89-mm vertical bore magnet equipped with a single proton channel and a 38-mm i.d. birdcage coil. Referring now to FIG. 3, the top left panel shows a conventional spin echo image of a tube phantom with a comb-like insert using a sinc excitation pulse. Matrix size=256×128. Phase encoding (128 steps) is along the left-right direction. The top middle panel shows the raw magnified image with 2× magnifying power and 128 phase encoding steps. The imaging focus was placed at the center groove. Focal magnification effect is clearly seen. The top right panel shows the "regridded" to 8192 in phase encoding direction with no smoothing. The bottom panel shows the one-dimensional profile of the center line across the grooves (top graph), where the center groove was defined by two pixels (middle graph). In the magnified regridded image the center groove was defined by four pixels (bottom graph).

FIGS. 4A-4C give another phantom example. Similar to FIG. 3, the imaging focus is placed at the syringe in the center. FIG. 4A illustrates a conventional image with a slice thickness of 2 mm, field of view of 32 mm and matrix size of 256×128. FIG. 4B is a raw magnified image using 128 phase-bending radiofrequency pulses with a magnifying power of 2×. FIG. 4C is a regridded image to 8192 in phase encoding direction. The edges of the syringe were sharpened in the magnified image (FIG. 3C), although the number of phase encoding steps (e.g., 128) is the same as in the conventional image (FIG. 3A).

Working Examples 4 and 5—In Vivo Experiments

In additional examples of the magnetic resonance magnification imaging techniques disclosed herein, FIGS. 5 and 6 illustrate examples of in vivo applications of the magnification imaging technique. In this regard, adult rats are imaged at 11.7 Tesla under 1.5% isoflurane anesthesia using a 15-mm single-loop transceiver surface coil (studies conducted under a protocol approved by NIMH Animal Care and Utilization Committee).

Figure 5A:
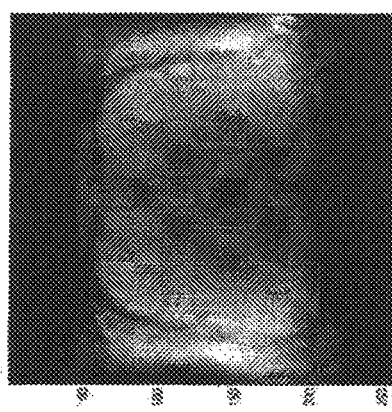
FIGS. 5A-5D depict examples of in vivo applications of magnetic resonance magnification imaging according to embodiments of the present disclosure.
Figure 5B:
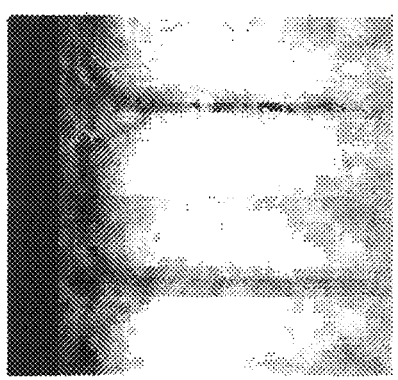
Figure 5C:
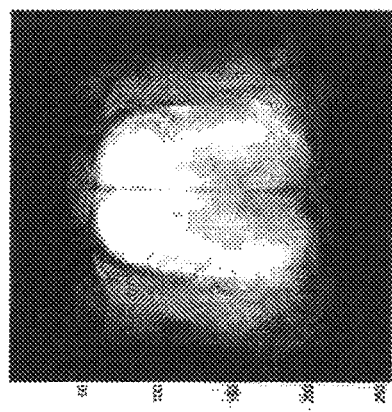
Figure 5D:
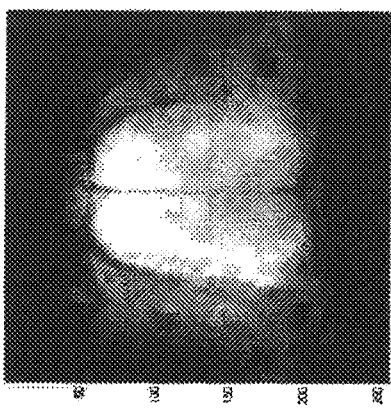

Referring now to FIGS. 5A-5D, a conventional horizontal image of a rat brain is shown in the top-left panel (FIG. 5A). With the imaging focus placed at the brain midline (magnifying power: 2×), anatomical details along the brain midline are better resolved as shown in FIG. 5B (raw magnified image) and FIG. 5C (regridded magnified image). Meanwhile, FIG. 5D shows a comparison of the olfactory bulb/cerebral cortex area. The anatomical details are better defined in the magnified image (FIG. 5B) than in the conventional MRI image (FIG. 5A).

Figure 6B:
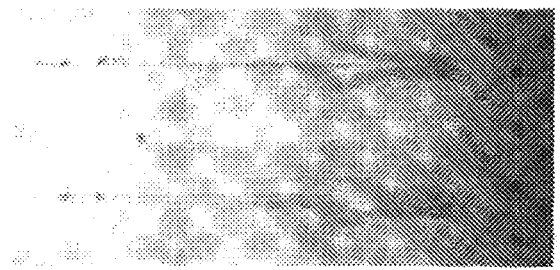
FIGS. 6A-6B depict additional examples of in vivo applications of magnetic resonance magnification imaging according to embodiments of the present disclosure.
Figure 6A:

FIGS. 6A-6B compare the conventional image of a horizontal slice of rat brain (FIG. 6A) with the magnified image of the same slice generated in accordance with the techniques disclosed herein (FIG. 6B). The imaging focus is placed at brain midline with a magnifying power of 3×. Fine anatomical structures along the midline are sharpened by magnification imaging. Notably, the aqueduct of Sylvius at the superior colliculus is visible in the magnified image only.

Working Example 6—Two-Dimensional Simulation

In another example of the magnetic resonance magnification imaging techniques disclosed herein, FIG. 7 demonstrates the combination of magnification imaging and PPI using a simulated phantom with three thin bars at its right edge. To this point, FIG. 7 shows that resolution enhancement from these two independent approaches multiplies (e.g., two-fold enhancement by PPI× two-fold enhancement by magnification imaging results in four-fold resolution enhancement). Since magnification imaging uses Fourier transform, or other similar mathematic formulae, for reconstruction, the magnified image can be folded and unfolded as in conventional PPI.

Referring to FIGS. 7A-7E, FIG. 7A illustrates a ground truth image while FIG. 7B shows an unfolded image reconstructed from eight folded images using conventional PPI. The 2× acceleration is along the left-right direction. The three bars at the right edge are not resolved due to limited spatial resolution. The middle panels show an individual folded magnified image and the unfolded raw magnified image. FIG. 7C is a folded magnified image from one individual coil, FIG. 7D is an unfolded raw magnified image using conventional PPI reconstruction and FIG. 7E is a regridded magnified PPI image. The imaging focus is placed at the right edge of the phantom. Due to 2× magnification, the three bars at the right edge are resolved. The raw magnified image may be unfolded using conventional PPI. The raw magnified image may then be regridded to generate a normal image (FIG. 7E). By combining magnification imaging with PPI, the spatial resolution at the right edge can be increased by 300% (2×2=4).

Working Example 7—Four-Fold Magnification

Figure 12:
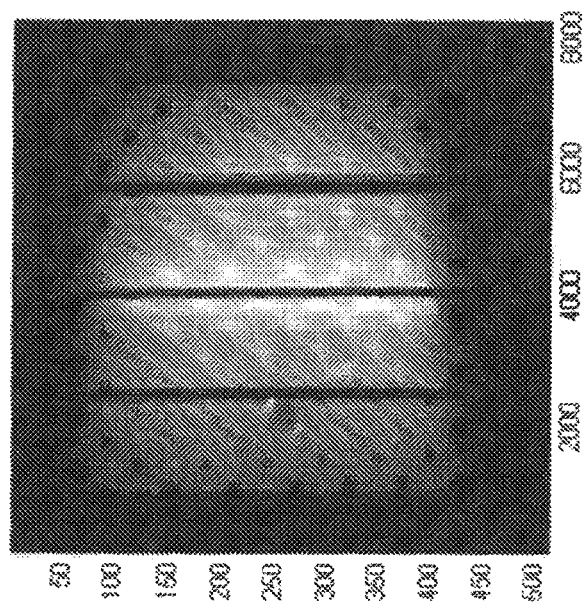
FIG. 12 shows an example of 4× magnification imaging of a phantom with three teeth.

Radiofrequency pulses using inverse Fourier transform can be designed to produce 4× magnification. FIG. 12 shows an example of 4× magnification imaging of a phantom with three teeth. The imaging focus was placed at the center tooth. Slice thickness is 2 mm, field of view is 32 mm and matrix size is 512×128. The image was regridded to 8192. Focal magnification effect was clearly seen in the 2D image where the edges of the center tooth were dramatically sharpened due to 4-fold focal magnification. In comparison, the left and right teeth were blurry due to lower spatial resolution there.

Multi-Foci Magnification Imaging

Figure 13:
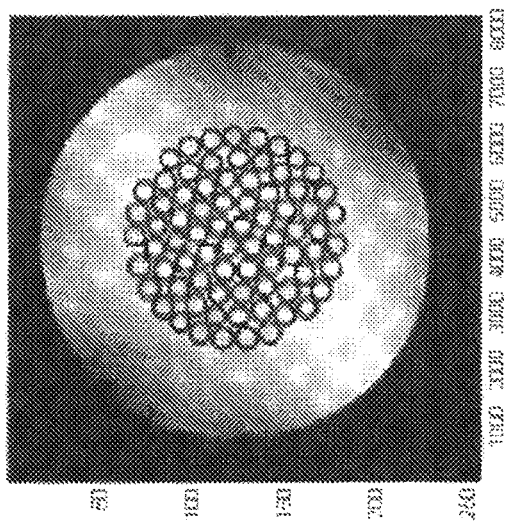
FIG. 13 shows an example of multi-foci magnification.

The magnetic magnification imaging techniques of the present disclosure may further incorporate multi-foci imaging. In particular, a double foci magnification technique may be utilized where the differential magnetization phase at the two edges of the field-of-view can be made to evolve faster than conventional MRI. This may lead to increased spatial resolution at the two sides of the field-of-view. Two or more imaging foci may be established at locations of anatomical interest. For example, FIG. 13 shows an image of a phantom containing a bundle of thin tubes with the same wall thickness. Slice thickness is 2 mm, field of view 32 mm and matrix size 256×128. Both the left and right sides of the bundle are magnified. Although the small tubes in the middle of the image are of low resolution the ones on both sides are much better resolved because of double-foci magnification. Spatial resolution at different imaging foci can be varied depending on desired spatial resolution. It is envisioned that the magnetic resonance imaging devices can incorporate a user-friendly interface that allows a user to prescribe multiple foci at locations of anatomical interest by drawing on scout images.

Conclusion

Accordingly, the magnetic resonance magnification imaging techniques disclosed herein use a fundamentally different approach to MRI image formation. In particular, specially designed radiofrequency pulses can interact with the magnetic field gradient(s) such that the region of interest is filled with more pixels, thereby increasing spatial resolution at the region of interest.

Implementation in Hardware and/or Software

The methods described herein can be implemented on specially-programmed hardware or software. For example, the methods can be implemented by a computer-readable medium. The computer-readable medium can be non-transitory and/or tangible. For example, the computer readable medium can be volatile memory (e.g., random access memory and the like) or non-volatile memory (e.g., read-only memory, hard disks, floppy discs, magnetic tape, optical discs, paper table, punch cards, and the like).

EQUIVALENTS

While the present subject matter has been described with reference to the above embodiments, it will be understood by those skilled in the art that various changes can be made and equivalents can be substituted for elements thereof without departing from the scope of the subject matter. In addition, many modifications can be made to adapt a particular situation or material to the teachings of the subject matter without departing from the essential scope thereof. Therefore, it is intended that the subject matter not be limited to the particular embodiment disclosed as the best mode contemplated for carrying out this subject matter, but that the subject matter will include all embodiments falling within the scope of the appended claims.

The functions of several elements may, in alternative embodiments, be carried out by fewer elements, or a single element. Similarly, in some embodiments, any functional element may perform fewer, or different, operations than those described with respect to the illustrated embodiment. Also, functional elements (e.g., modules, databases, computers, clients, servers and the like) shown as distinct for purposes of illustration may be incorporated within other functional elements, separated in different hardware or distributed in a particular implementation.

While certain embodiments according to the present subject matter have been described, the present subject matter is not limited to just the described embodiments. Various changes and/or modifications can be made to any of the described embodiments without departing from the spirit or scope of the present subject matter. Also, various combinations of elements, steps, features, and/or aspects of the described embodiments are possible and contemplated even if such combinations are not expressly identified herein.

What is claimed is:

1. An imaging method comprising:
   specifying an imaging focus region on a subject to be imaged;
   applying radiofrequency pulses to a region of interest of the subject to interact with a magnetic field gradient, wherein the radiofrequency pulses successively bend magnetization phases of respective electromagnetic signals from the specified imaging focus region, resulting in magnified pixel data, the radiofrequency pulses being determined by inverting a mathematical transform that relates transverse magnetization to the radiofrequency pulses as a function of the magnetic field gradient over space; and
   generating a magnified image of the imaging focus region based on the magnified pixel data.

2. The method of claim 1, further comprising:
   constructing the radiofrequency pulses to be applied according to a process that includes:
   designing a smoothly-varying monotonic magnetization phase curve from $-\pi$ to $\pi$ as the phase module;
   designing a trapezoid magnetization amplitude module with its two top vertices smoothed;
   extending the phase module at both ends to match the bottom two vertices of the amplitude module; and
   designing the radiofrequency pulses such that an amplitude of the frequency response of the radiofrequency pulses substantially matches the amplitude module, and a phase of the frequency response of the radiofrequency pulses substantially matches the phase module and its multiples.

3. The method of claim 2, wherein the radiofrequency pulses are designed using a Fourier transform.

4. The method of claim 1, wherein the generating of the magnified image further comprises:
   reconstructing the magnified pixel data in order to form the magnified image of the imaging focus region.

5. The method of claim 4, wherein the reconstructing of the magnified pixel data further comprises:
   mathematically inverting a process by which the magnified pixel data was formed.

6. The method of claim 4, wherein the reconstructing of the magnified pixel data further comprises:
   experimentally measuring a magnetization magnitude and a phase module on an imaging phantom.

7. The method of claim 4, wherein the magnified pixel data is reconstructed using a Fourier transform.

8. The method of claim 1, wherein the generating of the magnified image further comprises:
   regridding the magnified image to an image of larger size in a phase-encoding direction.

9. The method of claim 1, wherein the generating of the magnified image further comprises:
   smoothing the magnified image.

10. The method of claim 1, wherein the radiofrequency pulses successively bend the magnetization phases of respective electromagnetic signals during phase-encoding.

11. The method of claim 1, further comprising:
    specifying a plurality of imaging focus regions on the subject to be imaged.

12. The method of claim 1, wherein the imaging focus region is specified inside an image field-of-view.

13. The method of claim 12, further comprising:
    specifying a length of aperture stop inside the image field-of-view.

14. The method of claim 1, wherein an image of the subject at the imaging focus region is stretched in a phase-encoding direction, resulting in the magnified pixel data.

15. A non-transitory computer readable medium containing program instructions executable by a processor, the computer readable medium comprising:
    program instructions that specify an imaging focus region on a subject to be imaged;
    program instructions that determine radiofrequency pulses by inverting a mathematical transform that relates transverse magnetization to the radiofrequency pulses as a function of a magnetic field gradient over space;
    program instructions that control application of the radiofrequency pulses to a region of interest of the subject to interact with the magnetic field gradient, wherein the radiofrequency pulses successively bend magnetization phases of respective electromagnetic signals from the specified imaging focus region, resulting in magnified pixel data; and
    program instructions that generate a magnified image of the imaging focus region based on the magnified pixel data.

16. A magnetic resonance imaging device comprising:
    a magnetic field gradient controller programmed to control operation of a magnetic field gradient amplifier to alter a spinning frequency of atomic nuclei within a subject;
    a radio frequency pulse controller programmed to control operation of a radiofrequency transmitter to apply radiofrequency pulses to a region of interest within the subject;
    an analog/digital signal converter programmed to convert analog signals received by a radiofrequency receiver coil; and
    an imaging sequence controller programmed to:
    specify an imaging focus region on the subject;
    determine radiofrequency pulses by inverting a mathematical transform that relates transverse magnetization to the radiofrequency pulses as a function of a magnetic field gradient over space;

control application of the radiofrequency pulses to the region of interest of the subject to interact with a magnetic field gradient, wherein the radiofrequency pulses successively bend magnetization phases of respective electromagnetic signals from the specified imaging focus region, resulting in magnified pixel data; and generate a magnified image of the imaging focus region based on the magnified pixel data.

* * * * *